(12) United States Patent
Hattori

(10) Patent No.: US 7,397,883 B2
(45) Date of Patent: Jul. 8, 2008

(54) SPREAD SPECTRUM TYPE CLOCK GENERATION CIRCUIT FOR IMPROVING FREQUENCY MODULATION EFFICIENCY

(75) Inventor: Yuji Hattori, Tokyo (JP)

(73) Assignee: Seiko NPC Corporation, Tokyo (JP)

( * ) Notice: Subject to any disclaimer, the term of this patent is extended or adjusted under 35 U.S.C. 154(b) by 523 days.

(21) Appl. No.: 11/043,522

(22) Filed: Jan. 26, 2005

(65) Prior Publication Data

US 2005/0180490 A1 Aug. 18, 2005

(30) Foreign Application Priority Data

Feb. 18, 2004 (JP) ............................. 2004-041532

(51) Int. Cl.
*H03D 3/24* (2006.01)
*H04B 1/69* (2006.01)

(52) U.S. Cl. ...................................... 375/376; 375/147

(58) Field of Classification Search ................ 375/130, 375/140, 147, 146, 371–376, 242, 244, 245; 327/141, 150, 146–148, 155–157, 159, 164, 327/131, 126
See application file for complete search history.

(56) References Cited

U.S. PATENT DOCUMENTS

| 5,488,627 | A | 1/1996 | Hardin et al. |
| 5,631,920 | A | 5/1997 | Hardin |
| 6,404,834 | B1 | 6/2002 | Hardin et al. |
| 6,504,498 | B1 * | 1/2003 | O'Brien ..................... 341/143 |
| 6,559,698 | B1 | 5/2003 | Miyabe |
| 6,697,416 | B1 | 2/2004 | Jennings |
| 6,943,598 | B2 * | 9/2005 | Ghazali et al. .............. 327/147 |
| 6,975,687 | B2 * | 12/2005 | Jackson et al. .............. 375/297 |
| 2002/0022465 | A1 * | 2/2002 | McCullagh et al. ......... 455/260 |

FOREIGN PATENT DOCUMENTS

| JP | 9-098152 | 4/1997 |
| JP | 2001-117662 | 4/2001 |

OTHER PUBLICATIONS

Kim et al., "Spread Spectrum Clock generator with Delay Cell Array to Reduce Electromagnetic Interference," 2005, IEEE, pp. 908-920.*
Kim et al., "Spread Spectrum Clock generator with Delay Cell Array to Reduce EMI from a High-Speed Digital System," 2004, IEEE, pp. 820-825.*
Kao et al., "A Wide Input-Range $\Sigma\Delta$ Modulator for Application to Spread-Spectrum Clock generator," 2006, IEEE, pp. 830-833.*

* cited by examiner

*Primary Examiner*—Tesfaldet Bocure
(74) *Attorney, Agent, or Firm*—Jordan and Hamburg LLP

(57) ABSTRACT

The present invention provides a spread spectrum type clock generation circuit whose EMI for peripheral equipment is reduced. The clock generation circuit comprises a phase-locked loop circuit and a clock modulation circuit. The clock modulation circuit comprises a $\Delta\Sigma$ modulator, to frequency-modulate an output clock by modulating the frequency division number of a frequency divider in the phase-locked loop circuit by a digital circuit, and further comprises a modulation pattern controller for distributing the peak of a triangular waveform which is a modulation waveform generated by a modulation pattern generator to change the amplitude and the period thereof, thereby making it possible to eliminate dullness and distortion of a modulation waveform in a modulating method using a conventional analog circuit and to obtain an output clock having higher modulation efficiency than that in a case where a normal triangular waveform is employed in a conventional modulating method using a digital circuit.

6 Claims, 5 Drawing Sheets

SPREAD SPECTRUM TYPE CLOCK GENERATION CIRCUIT FOR IMPROVING FREQUENCY MODULATION EFFICIENCY

BACKGROUND OF THE INVENTION

1. Field of the Invention

The present invention relates to a clock generation circuit for frequency-modulating an output clock, and more particularly, to a Spread Spectrum type clock generation circuit whose electromagnetic interference (hereinafter referred to as EMI) for peripheral equipment is reduced.

2. Related Background Art

Conventionally, as EMI measures, a clock generator having a clock modulation circuit may be employed in many cases in order to reduce the number of components such as ferrite beads and a passive filter in a case where the frequency of a system operation clock exceeds 10 MHz. However, the higher frequency modulation efficiency is in the clock generator, the more effective the use of the clock generator is as the EMI measures.

In a case where frequency modulation is performed with respect to a general clock generation circuit, modulation efficiency in the frequency modulation indicates how much the peak value is reduced when the respective spectra of an output clock in a case where no modulation is performed and a case where modulation is performed are compared with each other. That is, the smaller the peak value becomes, the better the modulation efficiency is.

The modulation efficiency varies depending on the period and the amplitude of a modulation waveform. It is said that the modulation efficiency is best when the period of the modulation waveform is generally 20 kHz to 50 kHz. The larger the amplitude of the modulation waveform is, the higher the modulation efficiency becomes. When the amplitude is increased, however, the frequency of the output clock greatly swings, so that jitter is increased. When the jitter is too high, an IC using the output clock may be erroneously operated. Therefore, a method of increasing the amplitude of the modulation waveform to improve the modulation efficiency has a limit. Thus, the frequency modulation efficiency has been conventionally improved by changing the modulation waveform.

A first example of modulating methods conventionally known is a method of modulating a control signal to be fed to a voltage controlled oscillator (hereinafter referred to as VCO) in a phase-locked loop (hereinafter referred to as PLL), that is, an output of a charge pump by an analog circuit, to generate a modulated clock by intentionally changing the frequency of an output clock (see Japanese Unexamined Patent Publication No. 09-098152, U.S. Pat. No. 5,631,920).

It is generally said that as the inclination of a modulation wave form increases toward its peak portion, while decreasing toward its intermediate point when the amplitude and the period of the modulation waveform are respectively the same, the modulation efficiency thereof increases. In the above-mentioned conventional example, therefore, a modulation waveform generation apparatus capable of generating not a simple triangular waveform or sine waveform but a complicated waveform commonly called "hershey-kiss waveform" shown in FIG. 1 is employed in order to satisfy the above-mentioned inclination.

A second example of modulating methods conventionally known is a method of modulating the frequency division number of a frequency divider receiving an output of a VCO. In the second conventional example, it is possible to construct all constituent elements from one for generating a modulation waveform to one for adding a modulation component to the frequency division number of the frequency divider by a digital circuit and to generate a modulation component signal having a small number of steps of quantization by employing ΔΣ modulation to minutely change the modulation amplitude thereof (see Japanese Unexamined Patent Publication No. 2001-117662, U.S. Pat. No. 6,559,698).

In the above-mentioned first conventional example, a modulation signal is generated using the analog circuit, or using a digital-to-analog converter. Therefore, the modulation waveform is frequently distorted. Degradation of the frequency modulation efficiency due to the distortion second conventional example, the modulation waveform is generated by the digital circuit. From the viewpoint of eliminating the need for a complicated circuit, the modulation waveform is mainly a triangular waveform shown in FIG. 2. Since the slope of the triangular waveform is constant, however, the triangular waveform is inferior in frequency modulation efficiency.

SUMMARY OF THE INVENTION

An object of the present invention is to solve the above-mentioned problems. In order to attain the object, the present invention provides a spread spectrum type clock generation circuit having a phase-locked loop circuit and a clock modulation circuit.

The phase-locked loop circuit includes a voltage controlled oscillator for generating a clock signal, a frequency divider for dividing a frequency of the clock signal, and a phase frequency comparator for comparing an output of the frequency divider with the comparison frequency signal obtained by converting an external reference signal.

The clock modulation circuit is operated based on the clock signal with the intermediate divided number of frequency from the frequency divider, and controls the frequency division number of the frequency divider by using a given modulation pattern whose peak portion is controlled to distribute by the modulation pattern controller included in the clock modulation circuit. in the clock modulation circuit.

The clock modulation circuit may comprise a modulation pattern generator for generating a digital signal with the modulation pattern, a gain offset controller for adding a predetermined gain and offset to the digital signal, and a ΔΣ modulator for generating the digital signal with few bits by adding a quantization noise to the digital signal output from the gain offset controller.

By thus constructing the present invention, it is possible to eliminate problems such as dullness and distortion of a modulation waveform found in a modulating method using a conventional analog circuit. Further, it is possible to obtain an output clock having better modulation efficiency than that in a case where a normal triangular waveform in a modulating method using a conventional digital circuit is employed.

The more specific configuration of the phase-locked loop circuit composing the spread spectrum type clock generator according to the present invention includes a reference frequency divider for converting an external reference signal into a signal having a predetermined comparison frequency, a charge pump for generating a charge amount corresponding to a phase error signal generated in comparing the respective phases of the output signal of the frequency divider and the comparison frequency signal in the phase frequency comparator, and a loop filter inserted potential.

It is desirable that the loop filter has a series connection of a first capacitance and a resistance to a power supply voltage or ground and a second capacitance connected in parallel with the series connection, and it is desirable that the second capacitance has a value which is not less than one-tenth the first capacitance. By such a configuration, high-frequency noise generated by the ΔΣ modulator can be effectively removed.

According to the present invention, the peak of the modulation pattern of a modulation digital signal generated in the clock modulation circuit is distributed, thereby allowing the frequency modulation efficiency of the output clock to be improved.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
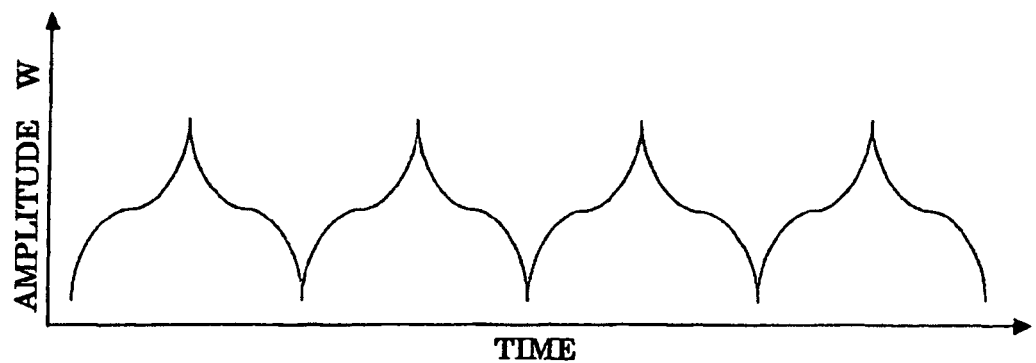
FIG. 1 is a schematic view of a hershey-kiss waveform which is a modulation waveform conventionally employed.
Figure 2:
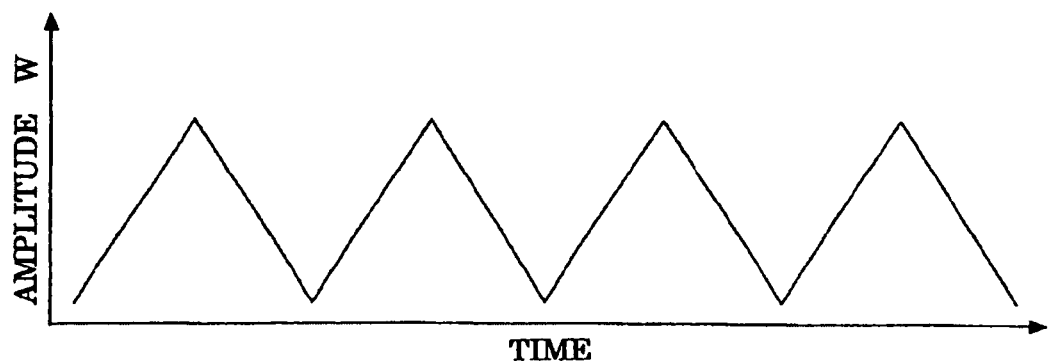
FIG. 2 is a schematic view of a triangular waveform which is a modulation waveform conventionally employed.
Figure 3:
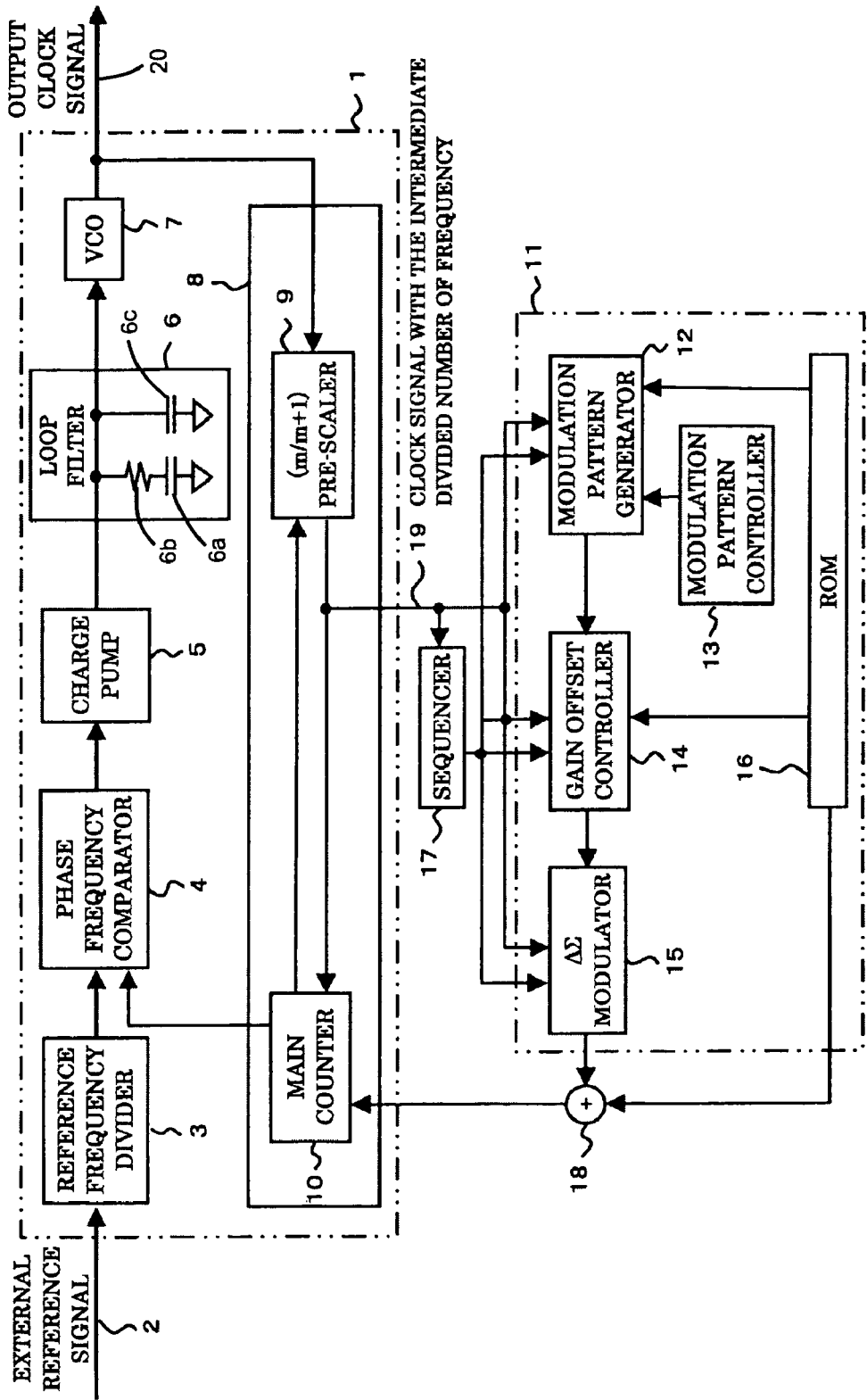
FIG. 3 is a block diagram for explaining an embodiment of a spread spectrum type clock generation circuit according to the present invention.

A suitable embodiment of the present invention will be described on the basis of the accompanying drawings. FIG. 3 is an explanatory view showing an example of a clock generation circuit according to the present invention. In FIG. 3, reference numeral 1 denotes a phase-locked loop circuit, and reference numeral 11 denotes a clock modulation circuit for generating a signal for clock modulation.

The phase-locked loop circuit 1 comprises the following constituent elements. Reference numeral 2 denotes an external reference signal. The external reference signal 2 is frequency-divided into a predetermined comparison frequency by a reference frequency divider 3. A phase frequency comparator 4 compares the phases of an output of the reference frequency divider 3 and an output of a frequency divider 8, described later, to generate an phase error signal. A charge pump 5 receives an output of the phase frequency comparator 4, to generate a charge amount corresponding to the phase error signal. Reference numeral 6 denotes a loop filter, which comprises a series connection of a first capacitance 6a and a resistance 6b to a power supply voltage or ground and a second capacitance 6c connected in parallel with the first capacitance 6a and the resistance 6b, to remove high-frequency noise. Reference numeral 7 denotes a VCO, which generates an output clock signal 20 corresponding to a voltage signal through the loop filter 6. Reference numeral 8 denotes a frequency divider, which frequency-divides an output of the VCO 7 into a predetermined comparison frequency.

The frequency divider 8 comprises a pre-scaler 9 and a main counter 10. The pre-scaler 9 changes the frequency division number into m or (m+1) by a mode switching signal generated by the main counter 10, and outputs a frequency-divided clock to the main counter 10. The main counter 10 is a downcounter for counting down the frequency division number, which reads its set value again when a counting operation in one set is terminated and repeats the downcounting.

The set value of the main counter 10 is generated by an adder 18. The adder 18 reads out a predetermined frequency division number N from a ROM 16 in the clock modulation circuit 11, described later, adds an output ΔN of the clock modulation circuit 11 to the division number N, and outputs the result of the addition.

The clock modulation circuit 11 comprises the following constituent elements. Reference numeral 12 denotes a modulation pattern generator, which generates a digital signal with a modulation pattern. The amplitude and the period of the modulation pattern is controlled by a modulation pattern controller 13. A gain offset controller 14 multiplies the amplitude of the modulation digital signal by a predetermined number set by the ROM 16, and adds the predetermined number set by the ROM 16 to the offset of the modulation pattern. A ΔΣ modulator 15 receives an output of the gain offset controller 14, to reduce the number of bits composing the modulation digital signal without making noise in a band of comparison frequencies as high as possible by performing $1^{st}$ order ΔΣ modulation, and output the number of bits as ΔN to the adder 18. The ΔN modulates the frequency division number of the frequency divider 8 and consequently, frequency-modulates an output clock.

The operation frequency of the clock modulation circuit 11 is determined by a clock signal with the intermediate divided number of frequency 19 and a sequencer 17 for generating timing upon receipt of the clock signal with the intermediate divided number of frequency 19. By changing the operation frequency, the output of the clock modulation circuit 11, that is, the modulation period of the output clock can be changed.

The operation of the above-mentioned clock generation circuit will be then described. First, the operation of the phase-locked loop circuit 1 will be described. The external reference signal 2 is frequency-divided into the predetermined comparison frequency by the reference frequency divider 3. The comparison frequency, together with a frequency divider signal outputted from the main counter 10 in the frequency divider 8, is inputted as a reference frequency divider signal to the phase frequency comparator 4. The phase frequency comparator 4 compares the phases of both the signals, detects a phase error, and outputs a phase error signal. The phase error signal is fed to the charge pump 5, and is converted into a charge amount proportional to the phase error which is fed to the loop filter 6. An output signal of the loop filter 6 varies depending on the phase error, to change the output clock signal 20 which is an output of the VCO 7 in the direction in which the phase error is reduced. in which the phase error is reduced.

The output of the VCO 7 is inputted to the frequency divider 8, and a frequency divider signal is outputted from the frequency divider 8. The frequency divider signal is compared with the reference frequency divider signal in the phase frequency comparator 4, as described above. The detected phase error is adjusted in the direction in which the error is reduced and is output from the VCO 7 through the loop filter 6. The series of operations is repeated, thereby making it possible to continuously hold the output clock signal 20 from the VCO 7 in a certain phase having a certain frequency. Both the reference frequency divider signal and the frequency divider signal are signals having a frequency called a comparison frequency.

The operations of the frequency divider 8 and the clock modulation circuit 11 will be then described. When the frequency divider 8 terminates a downcounting operation in one set, it updates the setting of the frequency division number before entering a downcounting operation in the subsequent one set. The frequency divider 8 feeds the clock signal with the intermediate divided number of frequency 19 from the pre-scaler 9 to the sequencer 17 during a frequency dividing operation. The sequencer 17 generates a timing signal required by the clock modulation circuit 11 using the clock signal with the intermediate divided number of frequency 19 inputted thereto. ΔΣ modulator 15 at its output stage, and adds quantization noise having a frequency at which noise in a band of comparison frequencies is made as low as possible to a modulation digital signal generated by the modulation pattern generator 12 and the gain offset controller 14, to reduce the number of bits composing the modulation digital signal and output the modulation digital signal as ΔN to the adder 18.

The operations of the modulation pattern generator 12 and the modulation pattern controller 13 will be described while referring to FIGS. 4 and 5 with respect to a case where a modulation waveform is taken as a triangular waveform, the change width of one step is taken as a, the maximum value n'max and the minimum value n'min of the number of steps are respectively taken as 11 and 7, and the change width x of the number of steps is taken as 2. In a flow chart shown in FIG. 4, the steps 201 to 203 and the steps S212 and S213 are respectively the operations of the modulation pattern controller 13, and the steps S204 to S211 are the operations of the modulation pattern generator 12.

Figure 4:
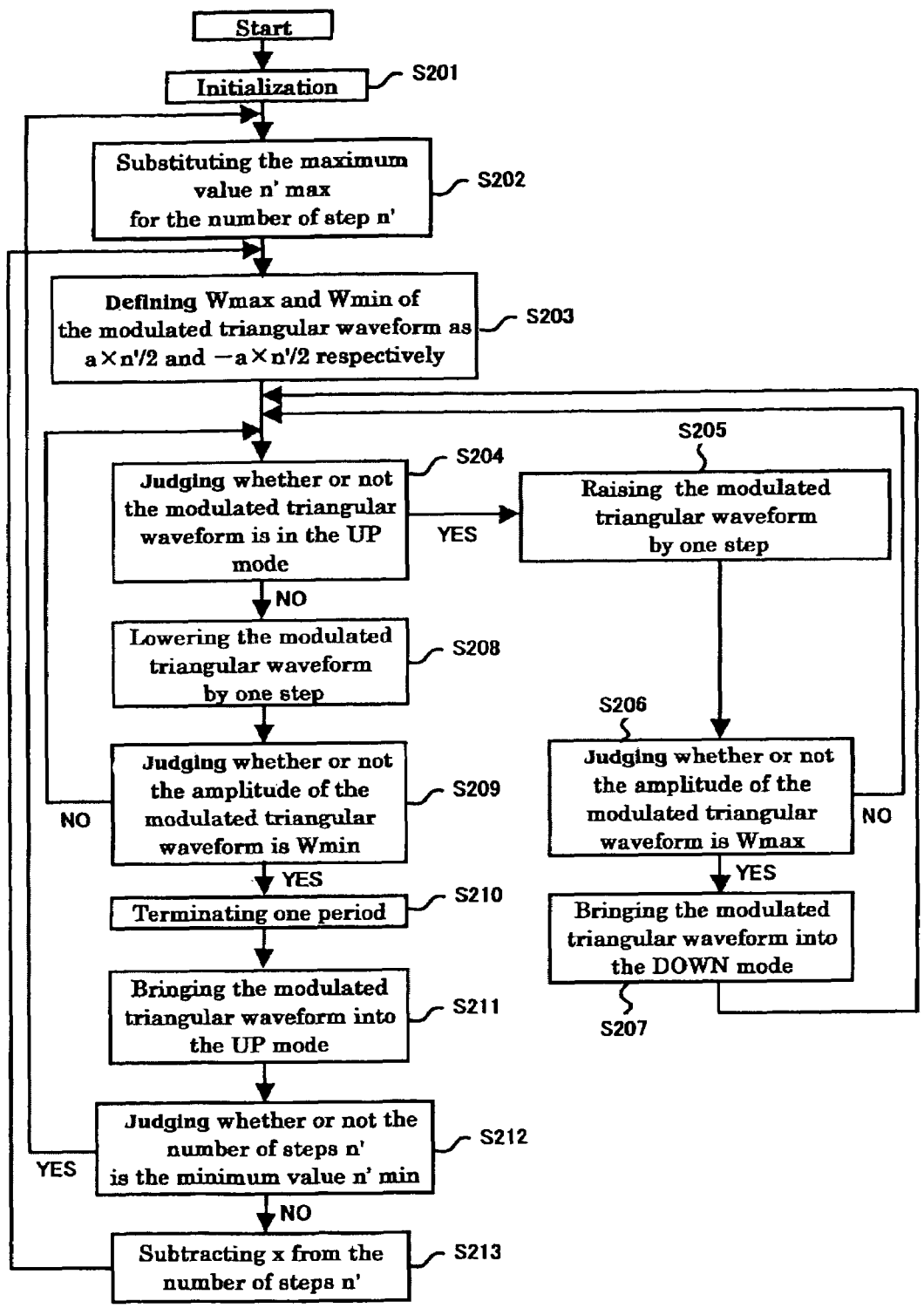
FIG. 4 is a flow chart for explaining the operations of a modulation pattern controller and a modulation pattern generator.
Figure 5:
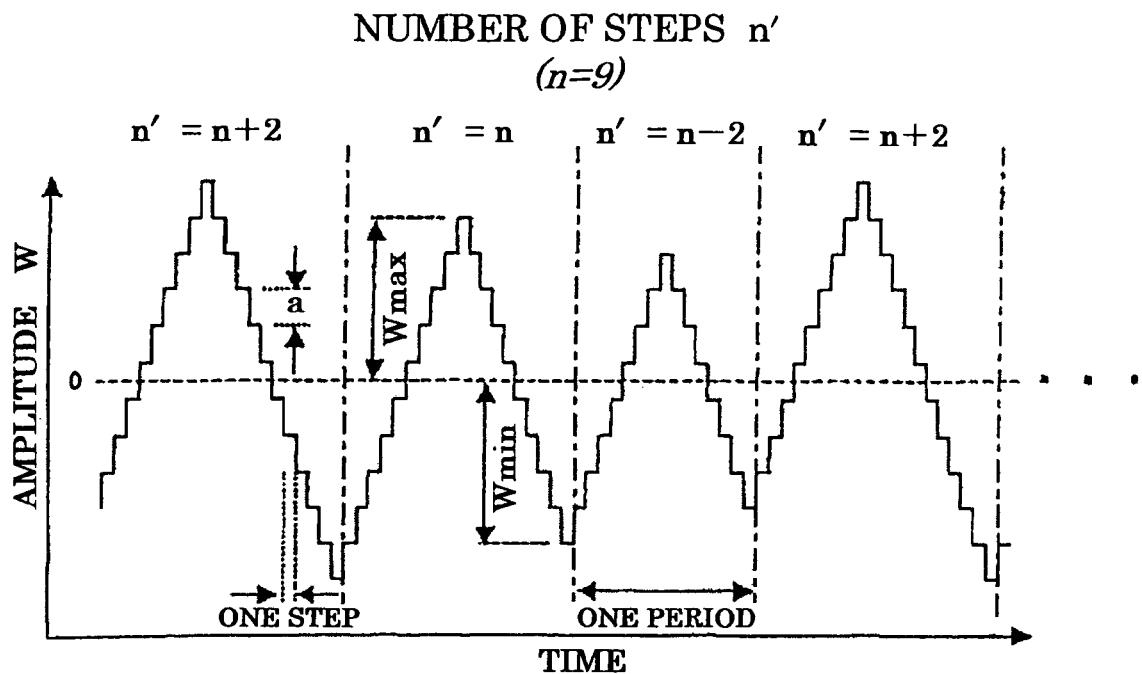
FIG. 5 is a waveform diagram of a modulation pattern outputted by a modulation pattern generator in a case where a modulation pattern controller is operated.

As shown in FIG. 4, when the operations are started upon turn-on of the power supply, the above-mentioned predetermined values previously set are respectively substituted in the change width of one step, the maximum value n'max and the minimum value n'min of the number of steps, and the change width x of the number of steps in the modulated triangular waveform as initialization in the step S201. The program then proceeds to the step S202. In the step S202, 11 which is the maximum value n'max is substituted in the number of steps n'. Further, the program proceeds to the step S203. In the step S203, the maximum value Wmax and the minimum value Wmin of the modulated triangular waveform are respectively defined as a×n'/2 and −a×n'/2 using the amplitude a at which the modulated triangular waveform is changed in one step and the number of steps n'.

The program then proceeds to the step S204. In the step S204, it is judged whether or not the modulated triangular waveform is currently in the UP mode. If the modulated triangular waveform is currently in the UP mode, the program proceeds to the step S205, where the modulated triangular waveform is raised by one step. On the other hand, if the modulated triangular waveform is in the DOWN mode, the program proceeds to the step S208, where the modulated triangular waveform is failed by one step.

Here, when the program proceeds to the step S205, the program proceeds to the step S206. In the step S206, it is judged whether or not the amplitude of the triangular waveform is the maximum value Wmax. If the amplitude is the maximum value, the program proceeds to the step S207, where the modulated triangular waveform is brought into the DOWN mode. On the other hand, unless the amplitude is the maximum value, the program is returned to the step S204, to repeat the foregoing operations. When the program proceeds to the step S207, the program is also returned to the step S204, to repeat the foregoing operations.

On the other hand, when the program proceeds to the step S208, the program proceeds to the step S209. In the step S209, it is judged whether or not the amplitude of the modulated triangular waveform is the minimum value Wmin. If the amplitude is the minimum value, the program proceeds to the step S210. In the step S210, one period of the modulated triangular waveform is terminated. On the other hand, unless the amplitude is the minimum value, the program is returned to the step S204, to repeat the foregoing operations. When the program proceeds to the step S210, the program proceeds to the step S211. In the step S211, the modulated triangular waveform is brought into the UP mode.

Furthermore, the program proceeds to the step S212 from the step S211. In the step S212, unless the number of steps n' is 7 which is the minimum value n'min, the program proceeds to the step S213. In the step S213, x, i.e., 2 is subtracted from n'. Thereafter, the program is returned to the step S202, to repeat the foregoing operations. Further, when it is judged in the step S212 that the number of steps n' is the minimum value, the program is returned to the step S202, to repeat the foregoing operations.

Figure 6:
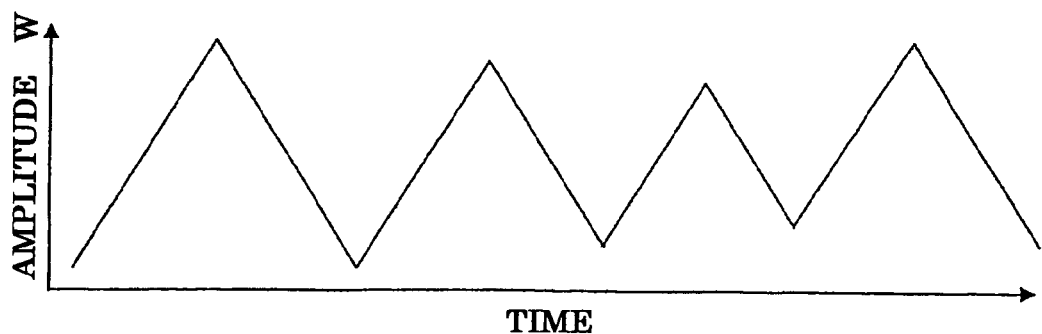
FIG. 6 is a schematic view of a modulation waveform used in the present embodiment.
Figure 7:
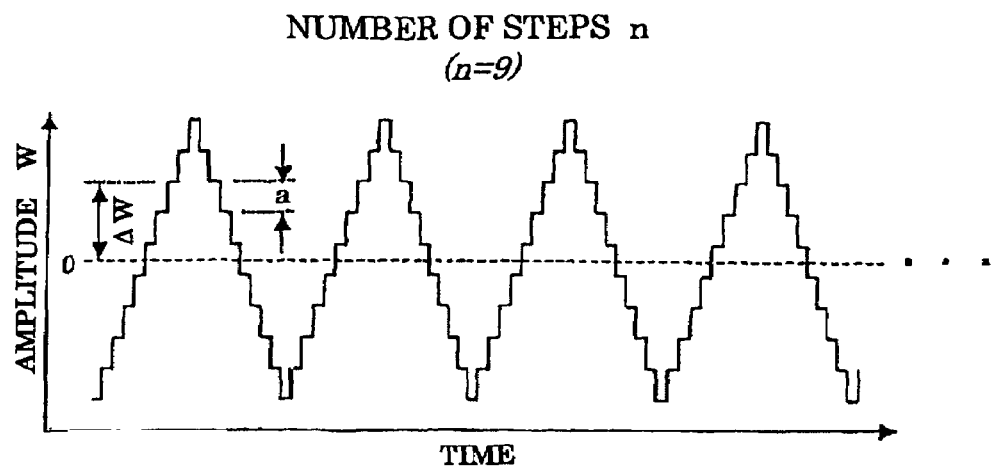
FIG. 7 is a waveform diagram for explaining the operation of a conventional modulation pattern.
Figure 8:
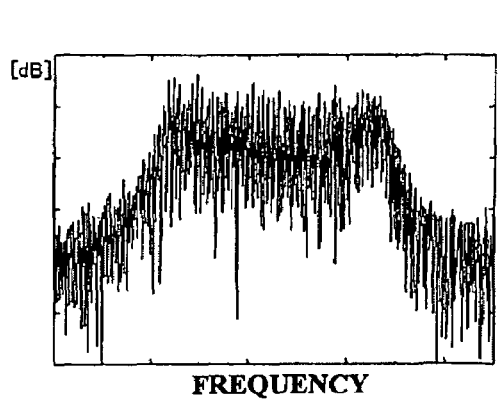
FIG. 8 is a spectrum diagram for explaining the spectrum characteristics of an output clock in a case where the modulation pattern shown in FIG. 5 is used.
Figure 9:
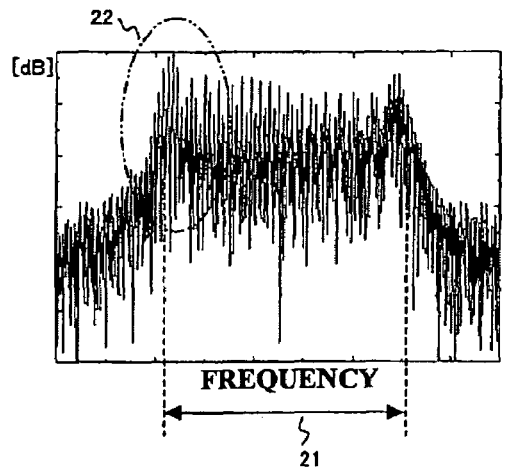
FIG. 9 is a spectrum diagram for explaining the spectrum characteristics of an output clock in a case where the modulation pattern shown in FIG. 7 is used.

The modulation pattern controller 13 thus controls the amplitude and the period of the modulation pattern output by the modulation pattern generator 12, to change the amplitude and the period by a predetermined value, to generate a modulated triangular waveform as shown in FIG. 6. FIG. 7 is an actual modulation waveform generated by the modulation pattern generator 12 when the modulation pattern controller 13 does not exist, and FIGS. 8 and 9 are examples of the spectrum of the output clock signal in a case where FIGS. 5 and 7 are used as modulation patterns. In the comparative example, the modulation waveform is taken as a triangular waveform employed in a normal digital system, and the number of steps n in the triangular waveform is 9 which is the same as that in the above-mentioned embodiment.

An output of the ΔΣ modulator 15, that is, an output obtained by subjecting the gain and the offset of the modulation pattern to $1^{st}$ order ΔΣ modulation is a modulation component of the frequency divider 8. Letting ΔW be the amplitude of the modulation pattern at each time, therefore, when the amplitude ΔW of the modulation pattern is not uniformly distributed in time, therefore, distribution efficiency, that is, frequency modulation efficiency of the output clock is degraded. In the case shown in FIG. 7, the number of steps in the triangular waveform is constant. Therefore, points at which the same amplitude ΔW is obtained exist at very close times before and after switching of the of the triangular waveform corresponds to both ends of a trapezoid in the spectrum of the final output. The spectrum of an output clock frequency which is the final output is not uniform energy in a desired frequency band indicated by a range 21 in FIG. 9, and has a peak higher than the uniform energy at both ends of the spectrum shown in FIG. 8 in the present embodiment in a particular portion enclosed by a broken line 22, thereby degrading the frequency modulation efficiency.

In the present embodiment, the amplitude and the period of the modulation pattern are changed, thereby solving the degradation of the frequency modulation efficiency. That is, in the present embodiment as shown in FIG. 5, the amplitude and the period are changed by taking the number of steps n' in the triangular waveform as a repetition of (n+2), n, (n−2), (n+2), n, (n−2) . . . to distribute the peak of the triangular waveform, to reduce the incidence probability of points at which the same amplitude ΔW is obtained at very closer times than those shown in FIG. 7 by one-third. Consequently, as shown in FIG. 8, a uniform spectrum can be obtained without energy concentration at the bottom of the trapezoid as shown in FIG. 9.

Although in the above-mentioned embodiment, the modulation pattern controller 13 controls the number of steps in the triangular waveform, the step width and the offset of the triangular waveform may be similarly controlled to distribute the peak of the triangular waveform in the same manner as described above. Although the number of steps is distributed among three patterns, i.e., (n+2), n, (n−2), the distribution number is not limited to three. The change width of the number of steps is not limited to +2 or −2.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A spread spectrum type clock generation circuit, comprising:
    a phase-locked loop circuit including:
        a voltage controlled oscillator for generating a clock signal;
        a frequency divider for dividing a frequency of the clock signal; and
        a phase frequency comparator for comparing an output signal of the frequency divider with a comparison frequency signal obtained by converting an external reference signal; and
    a clock modulation circuit being operated based on the clock signal with an intermediate divided number of frequencies from the frequency divider, the clock modulation circuit controlling a frequency division number of the frequency divider by using a given modulation pattern, the clock modulation circuit including a modulation pattern controller for controlling the modulation pattern so as to distribute a peak portion of the modulation pattern.

2. The spread spectrum type clock generation circuit according to claim 1, wherein the clock modulation circuit comprises:
    a modulation pattern generator for generating a digital signal with the modulation pattern;
    a gain offset controller for adding a predetermined gain and offset to the digital signal; and
    a ΔΣ modulator for generating the digital signal with few bits by adding a quantization noise to the digital signal output from the gain offset controller.

3. The spread spectrum type clock generation circuit according to claim 1, wherein the phase-locked loop circuit comprises:
    a reference frequency divider for converting the external reference signal into the comparison frequency signal having a predetermined frequency;
    a charge pump for generating a charge amount corresponding to a phase error signal generated by comparing respective phases of the output signal of the frequency divider and the comparison frequency signal in the phase frequency comparator; and
    a loop filter inserted between an output terminal of the charge pump and a particular potential.

4. The spread spectrum type clock generation circuit according to claim 3, wherein the loop filter comprises:
    a first capacitance and a resistance which are connected in series with a power supply voltage or ground; and
    a second capacitance connected in parallel with the first capacitance and the resistance.

5. The spread spectrum type clock generation circuit according to claim 4, wherein the second capacitance has a capacitance value which is not less than one-tenth of another capacitance value of the first capacitance.

6. A spread spectrum type clock generation circuit, comprising:
    a phase-locked loop circuit including:
        a voltage controlled oscillator for generating a clock signal;
        a frequency divider for dividing a frequency of the clock signal; and
        a phase frequency comparator for comparing an output signal of the frequency divider with a comparison frequency signal obtained by converting an external reference signal; and
    a clock modulation circuit being operated based on the clock signal with an intermediate divided number of frequencies from the frequency divider, the clock modulation circuit controlling a frequency division number of the frequency divider by using a given modulated triangular waveform, the clock modulation circuit including a modulation pattern controller for controlling a number of steps in the triangular waveform, a step width and an offset of the triangular waveform, so as to distribute a peak portion of the modulation pattern.

* * * * *